(12) United States Patent
Bhatacharya et al.

(10) Patent No.: US 7,339,433 B2
(45) Date of Patent: Mar. 4, 2008

(54) DIFFERENTIAL AMPLIFIER STAGE

(75) Inventors: Anindya Bhatacharya, Tucson, AZ (US); David F. Cox, Tucson, AZ (US)

(73) Assignee: Apex Microtechnology Corporation, Tucson, AZ (US)

( * ) Notice: Subject to any disclaimer, the term of this patent is extended or adjusted under 35 U.S.C. 154(b) by 148 days.

(21) Appl. No.: 11/389,574

(22) Filed: Mar. 15, 2006

(65) Prior Publication Data
US 2007/0216483 A1 Sep. 20, 2007

Related U.S. Application Data

(60) Provisional application No. 60/661,753, filed on Mar. 15, 2005.

(51) Int. Cl.
*H03F 3/45* (2006.01)
(52) U.S. Cl. .................................... 330/257
(58) Field of Classification Search ............... None
See application file for complete search history.

(56) References Cited

U.S. PATENT DOCUMENTS

| | | | | |
|---|---|---|---|---|
| 5,506,537 A | * | 4/1996 | Kimura | 327/351 |
| 5,515,005 A | * | 5/1996 | Yoshioka | 330/255 |
| 5,656,969 A | * | 8/1997 | Pulvirenti et al. | 327/561 |
| 5,815,039 A | * | 9/1998 | Kimura | 330/252 |
| 7,176,760 B2 | * | 2/2007 | Jones | 330/253 |
| 7,183,852 B2 | * | 2/2007 | Abe | 330/257 |
| 2005/0271109 A1 | * | 12/2005 | Mertelloni et al. | 365/206 |
| 2006/0214700 A1 | * | 9/2006 | Nairn | 327/77 |

OTHER PUBLICATIONS

Castello, et al., "A High-Performance Micropower Switched-Capacitor Filter", IEEE Journal of Solid-State Circuits, vol. SC-20, No. 6, Dec. 1985.
Seevinck, et al., "A Versatile CMOS Linear Transconductor/Square-Law Function Circuit", IEEE Journal of Solid-State Circuits, vol. SC-22, No. 3, Jun. 1987.
Li et al., "A Ratio-Independent Algorithmic Analog-to-Digital Conversion Technique", IEEE Journal of Solid-State Circuits, vol. SC-19, No. 6, Dec. 1984.

* cited by examiner

*Primary Examiner*—Robert Pascal
*Assistant Examiner*—Krista M Flanagan
(74) *Attorney, Agent, or Firm*—Hayes Soloway P.C.

(57) ABSTRACT

A differential amplifier stage includes one active load circuit connected to a pair of cross-coupled transistors that produce a differential signal. The active load circuit controls the rise time of the differential signal. The differential amplifier stage also includes another active load circuit connected to the pair of cross-coupled transistors. The second active load circuit controls the fall time of the differential signal.

19 Claims, 11 Drawing Sheets

DIFFERENTIAL AMPLIFIER STAGE

RELATED APPLICATION AND TECHNICAL FIELD

This application is related to the following U.S. application, of common assignee, from which priority is claimed, and the contents of which are incorporated herein in their entirety by reference: "Monolithic Power Amplifier," U.S. Provisional Patent Application Ser. No. 60/661,753, filed Mar. 15, 2005.

This disclosure relates to improving amplifier performance and, more particularly, to increasing amplifier slew rate while decreasing quiescent power dissipation.

BACKGROUND

Amplifiers such as operational amplifiers are used in many electronic circuits to condition, manipulate and amplify signals. In general, an operational amplifier is designed so that the output signal of the amplifier is proportional to the difference between two input signals. While some operational amplifiers may be designed for a wide range of applications, others are designed for specific applications. For example, some may be designed for relatively high-voltage supplies to provide output signals with large voltages. Along operating with high-voltage applications, some designs may also be tailored for relatively fast-switching applications. Such high-power, fast-switching operational amplifiers may be implemented with discrete components and/or with hybrid circuitry. Such implementations call for considerable layout space and production cost.

In addition to a need for faster-switching, increased slew rate (i.e., maximum rate at which the output voltage of the operational amplifier can change) is desirable. However, slew rate may be constrained by the amount of current drawn by the operational amplifier during periods of inactivity. This quiescent current may be significant in high-power operational amplifiers. By reducing quiescent current, quiescent power dissipation may be lowered and operational amplifier performance may increase.

SUMMARY OF THE DISCLOSURE

In accordance with an aspect of the disclosure, a differential amplifier stage includes one active load circuit connected to a pair of cross-coupled transistors that produce a differential signal. The active load circuit controls the rise time of the differential signal. The differential amplifier stage also includes another active load circuit connected to the pair of cross-coupled transistors. The second active load circuit controls the fall time of the differential signal.

In one embodiment, either or both of the active load circuits may include a current mirror. The rise time controlled by the first active load circuit may be substantially equivalent to or different from the fall time controlled by the second active load circuit. The second active load circuit may include a cascode current mirror, a wide swing cascode current mirror, a regulated cascode current mirror, a regulated wide swing cascode current mirror, a Wilson current mirror, and/or other similar current mirror.

In accordance with another aspect of the disclosure, an apparatus includes an integrated circuit that includes an operational amplifier. The operational amplifier includes an active load circuit connected to a pair of cross-coupled transistors that produce a differential signal. The active load circuit controls the rise time of the differential signal. The operational amplifier also includes another active load circuit connected to the pair of cross-coupled transistors. The second active load circuit controls the fall time of the differential signal.

In one embodiment, either or both of the active load circuits may include a current mirror. The rise time controlled by the first active load circuit may be substantially equivalent to or different from the fall time controlled by the second active load circuit. The slew rate of the operational amplifier may be defined, as least in part, by the first and second active load circuits. The apparatus may further include a compensation resistor and capacitor that are located external to the integrated circuit. The compensation resistor and capacitor may be connected to the operational amplifier to increase stability.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE EMBODIMENTS

Figure 1:
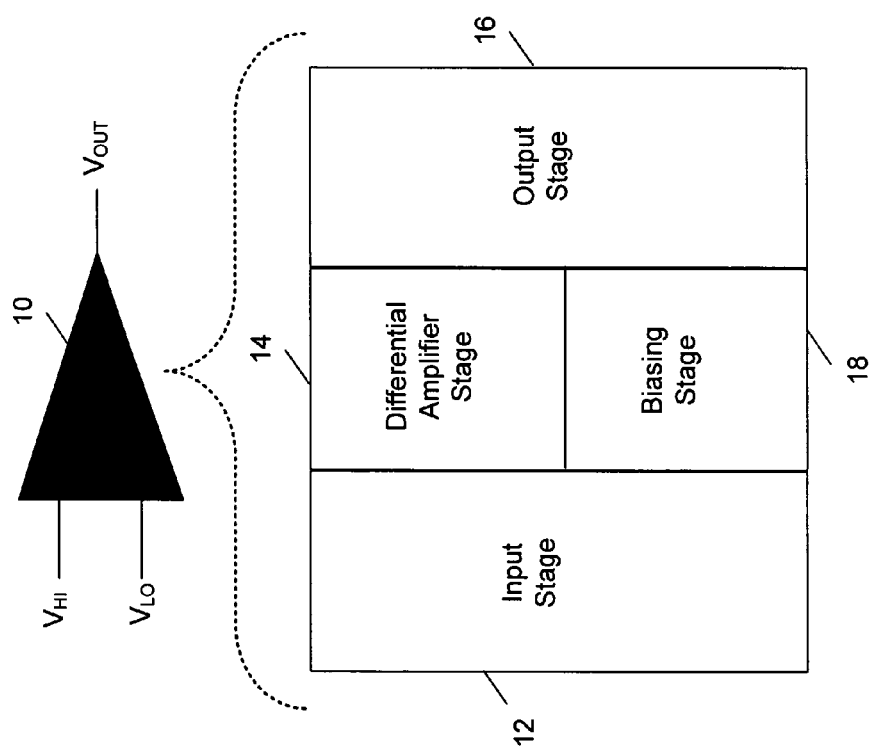
FIG. 1 is a block diagram representing stages included in an operational amplifier.

Referring to FIG. 1, a graphical representation of an operational amplifier 10 is shown that may include two input ports that may be capable of respectively receiving a high (labeled $V_{HI}$) and low (labeled $V_{LO}$) portions of an input signal. These input ports may be referred to as the inverting and non-inverting inputs of the operational amplifier. Operational amplifier 10 may also include an output port (labeled $V_{OUT}$) that provides an output signal that may be an amplified version of the difference of the $V_{HI}$ and $V_{LO}$ signals. To produce this output, which may include applying a relatively high voltage gain, operational amplifier 10 may include numerous stages. Some of these stages are represented in the figure. For example, operational amplifier 10 may include an input stage 12 that may receive signals from the two input ports and that may condition the signals. A differential amplifier stage 14 may apply a relatively high voltage gain to the difference signal. In some embodiments this amplified difference signal may be provided to an output stage 16 that conditions and provides the signal ($V_{OUT}$) to the output port of the operational amplifier.

One or more types of output stages may be implemented in operational amplifier 10. For example, a class A output stage may be implemented that may provide linear amplification with reduced distortion levels. Class B output stages may also be implemented and may provide increased efficiency (compared to class A), however, distortion levels may increase. In still another embodiment, a class AB output stage may provide moderate efficiency with reduced distortion levels due to a biasing signal (e.g., bias current) that may be provided to the output stage. In this embodiment, to provide one or more biasing signals, operational amplifier 10 includes a biasing stage 18.

As described below, operational amplifier 10 may be implemented on a single integrated circuit (IC) and used in high-power, fast-switching applications. However, in some embodiments, the architecture of operational amplifier 10 may be distributed across two or more IC chips. By providing such a high-performance amplifier in a single IC, production costs may be reduced since discrete components or a hybrid design may be absent from the design. To provide this high-power, fast-switching functionality, operational amplifier 10 may provide increased slew rates while reducing quiescent power dissipation. As described below, slew rate may be increased by including two active loads in differential amplifier stage 14. Furthermore, by reducing the dependence of differential amplifier stage 14 on biasing stage 18, quiescent current may be reduced. In some embodiments, operational amplifier 10 may be designed for a relatively wide supply voltage range (e.g., 10 volt to 350 volt) and a relatively large output current (e.g., 150 mA). For example, the output voltage may swing from approximately +172.5 volts to −172.5 volts for a ±175 volts supply. The architecture described below may also be implemented in a relatively low power operational amplifier.

Figure 2:
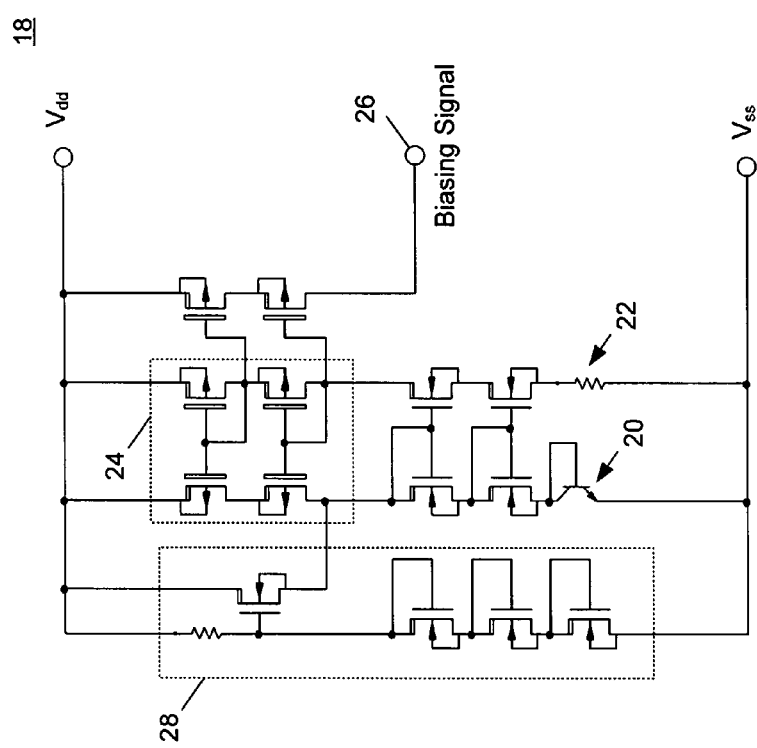
FIG. 2 is a circuit diagram representing a portion of a biasing stage included in the operational amplifier shown in FIG. 1.

FIG. 2 is a portion of biasing stage 18 that may be supplied power by a high (labeled $V_{dd}$) and low (labeled $V_{ss}$) voltage lines. A bipolar NPN transistor 20 may be connected to function similar to a diode and produce a reference current for operational amplifier 10. The diode voltage may have a relatively low temperature coefficient of e.g., −1.8 mV/K. A resistor 22 may also be included in biasing stage 18 and the resistor may also have a relatively low temperature coefficient e.g., −0.2 mV/K. Due to these temperature coefficients, this biasing scheme may have a negative temperature coefficient. For this embodiment biasing stage 18 may operate properly with a relatively small voltage from the high and low voltage lines. This voltage may be approximately equivalent to:

$$V_{be}+2 \cdot \Delta V_{NMOS}+V_{THN}+2 \cdot \Delta V_{PMOS}+V_{THP} \approx 7 \text{ V}$$

In this representation $V_{be}$ may be the base-to-emitter voltage of transistor 20. $\Delta V_{NMOS}$ may be a minimum voltage present across the drain and source terminals of NMOS field-effect transistors (FETs) included in biasing stage 18 to place them substantially into saturation. Similarly, $\Delta V_{PMOS}$ may be a voltage present across the drain and source terminals that place PMOS FETs included in biasing stage 18 substantially into saturation. $V_{THN}$ and $V_{THP}$ respectively may be threshold voltages of the NMOS and PMOS FETs.

Biasing stage 18 may also include a PMOS cascode current mirror, which is highlighted by dashed-box 24. The current mirror may regulate the current that flows through transistor 20 and resistor 22 that provides a biasing signal on terminal 26 for differential amplifier stage 14. In this embodiment, biasing stage 18 may provide a biasing current $I_B$ that may be equivalent to the base-to-emitter voltage ($V_{BE}$) of transistor 20 divided by the resistance of resistor 22. Biasing current $I_B$ may have a relatively low value (e.g., 63 μA) at room temperature. However, as temperature increases and decreases, the biasing current inversely decreases and increases with the temperature. To reduce the probability of $I_B$ having a value of zero, a start-up circuit, which is highlighted by dashed-box 28, may be included in biasing stage 18.

Figure 3:
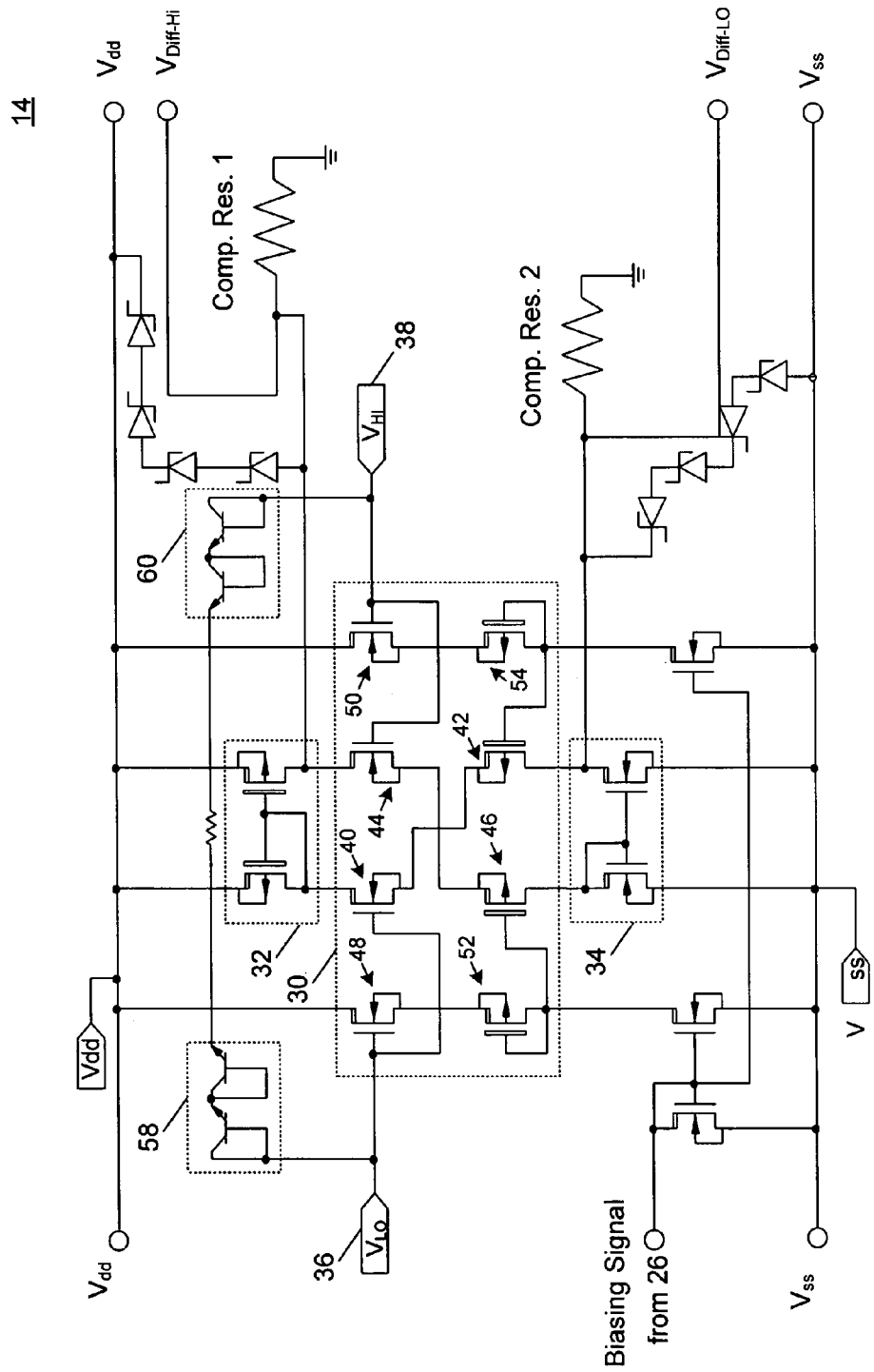
FIG. 3 is a circuit diagram representing a portion of a differential amplifier stage that includes active load circuits for controlling the slew rate of the operation amplifier shown in FIG. 1.

FIG. 3 is an exemplary design for differential amplifier stage 14 that may increase the slew rate and reduce the quiescent current of operational amplifier 10. In some conventional differential amplifier stages, the biasing current provided a biasing stage may limit the slew rate of an operational amplifier. However, by reducing the dependency upon the biasing current, slew rates may be increased. To reduce the dependency upon the biasing current ($I_B$), differential amplifier stage 14 may include two pairs of cross-coupled transistors, which are highlighted by dashed-box 30. By cross-coupling a pair of complementary MOS transistors, the combination of transistors may substantially operate as a single MOS transistor. However, the combination of transistors may be substantially controlled by a zero-current port. Additionally, threshold voltage and transconductance of the combination may be a function of the respective threshold voltages and transconductances of the individual transistors. Differential amplifier stage 14 includes two pairs of cross-coupled transistors. Each pair may substantially operate as a signal transistor, thereby providing two transistors for producing a differential signal from the two input signals. Individual transistors may be implemented rather than the cross-coupled pairs. However, a current source may need to be incorporated for proper operating of the individual transistors. Correspondingly, the current source may undesirably limit the slew rate of differential amplifier stage 14. So, by implementing the cross-coupled transistor pairs, current that may control transistor operations and that may limit slew rate may be reduced.

Additionally, to reduce the dependence upon biasing current $I_B$, and increase the slew rate of operational amplifier 10, differential amplifier stage 14 may include a pair of active loads (highlighted by dashed boxes 32 and 34) that may be switched into the circuit by the cross-coupled transistors (shown in dashed box 30). In this embodiment, each of the active loads (highlighted by dashed boxes 32 and 34) may include a current mirror circuit that may be configured to respectively "pull-up" or "pull-down" the current being provided to the cross-coupled transistors. For example, the current mirror in dashed box 32 may control the rise-time of current provided by the cross-coupled transistors (i.e., "pull-up") and the current mirror in dashed box 34 may control the fall time of the current signal (i.e., the "pull-down") of the cross-coupled transistors. By using active loads to control "pull-up" and "pull-down" times, the rise and fall times may not be constrained by the biasing current $I_B$.

Various types of current mirrors may be implemented in differential amplifier stage 14 as active loads. For example, one or both of the active loads (highlighted by dashed box 32 and 34) may be cascode current mirrors. Either active load may also be a wide swing cascode current mirror that may be implemented for relatively low-voltage, high-gain differential amplifiers. A regulated cascode current mirror design may also be implemented to improve output impedance. For relatively low-voltage and high-output impedance, a regulated wide swing cascode current mirror design may be implemented. To provide substantially constant currents in DC conditions and improve output impedance, a Wilson current mirror design may be implemented in one or both of the active loads included in differential amplifier stage 14.

To demonstrate the reduced dependence on biasing current $I_B$, assume that inputs 36 (labeled $V_{LO}$) and 38 (labeled $V_{HI}$) for differential amplifier stage 14 may be each connected to ground (i.e., zero volt potential) such that the biasing current $I_B$ flows through the current mirror transistors (included in the active loads) and the cross-coupled transistors. For demonstrative purposes, an input differential voltage may be defined as:

$$V_{DI}=(V_{LO})-(V_{HI}).$$

When the voltage on input 36 ($V_{LO}$) increases (i.e., $V_{DI}$ becomes more negative), the current through transistors 40 and 42 increases while the current in transistors 44 and 46 decreases. This pulling up and pulling down of the current through the cross-coupled transistors is respectively controlled by the current mirrors (included in the active loads). Thereby, the slew rate of operational amplifier 10 may not be completely controlled by the biasing current provided by biasing stage 18.

In this exemplary embodiment, transistors 48 and 50 may be configured as source-followers for transferring the input voltage signals to transistors 46 and 42. The differential gain at the top of the cross-coupled transistors may be represented as:

$$\frac{V_{Diff-HI}}{V_{DI}} = \frac{r_{o32}}{\left(\frac{1}{g_{m40}}\right)+\left(\frac{1}{g_{m42}}\right)}.$$

In this expression $r_{o32}$ represents the output resistance of the current mirror (included in the active load shown in dashed box 32) and $g_m$ represents the small signal transconductance of a transistor. For example, $g_{m40}$ represents the small signal transconductance of transistor 40 and $g_{m42}$ represents the small signal transconductance of transistor 42. Similarly, the differential gain at the bottom of the cross-coupled transistors may be represented as:

$$\frac{V_{Diff-LO}}{V_{DI}} = \frac{r_{o34}}{\left(\frac{1}{g_{m44}}\right)+\left(\frac{1}{g_{m46}}\right)}$$

In this representation $r_{o34}$ represents the output resistance of the current mirror (included in the active load shown in dashed box 34) and $g_{m44}$ represents the small signal transconductance of transistor 44 and $g_{m46}$ represents the small signal transconductance of transistor 46.

By implementing the two current mirrors (respectfully included in the active loads highlighted by dashed boxes 32 and 34), both the rising and falling edges of the current signal provided by the cross-coupled transistors are controlled. In some embodiments, the gain provided by the cross-coupled transistors also may provide a relatively high impedance node. This may introduce a pole into the system that may increase the instability of operational amplifier 10. To account for this pole, an additional compensation stage may be included in or connected to differential amplifier stage 14. For example, a compensation stage that may include a capacitor and/or a resistor may be incorporated into differential amplifier stage 14. Also, during slewing some of the cross-coupled transistors may be turned off. For example, transistors 40 and 42 may be in an "off" state and the time needed to place the transistors in an "on" state may degrade the high-frequency performance of operational amplifier 10.

In addition to reducing the constraining effects of biasing current $I_B$ on the slew rate of operational amplifier 10, by reducing the needs for a relatively large $I_B$, the quiescent current (i.e., current flow when of no load is present and both inputs are connected together e.g., to ground) is reduced. For example, the quiescent current may be reduced to levels such as 700 μA when operating at room temperature (with no input signal). For conventional high-voltage operational amplifiers, the quiescent current may be relatively large for providing relatively high slew rates. But, due to the reduced effects of biasing current $I_B$ provided by the cross-coupled transistors and the two current mirrors, slew rates may be increased while a relatively low quiescent current may be provided.

Figure 4:
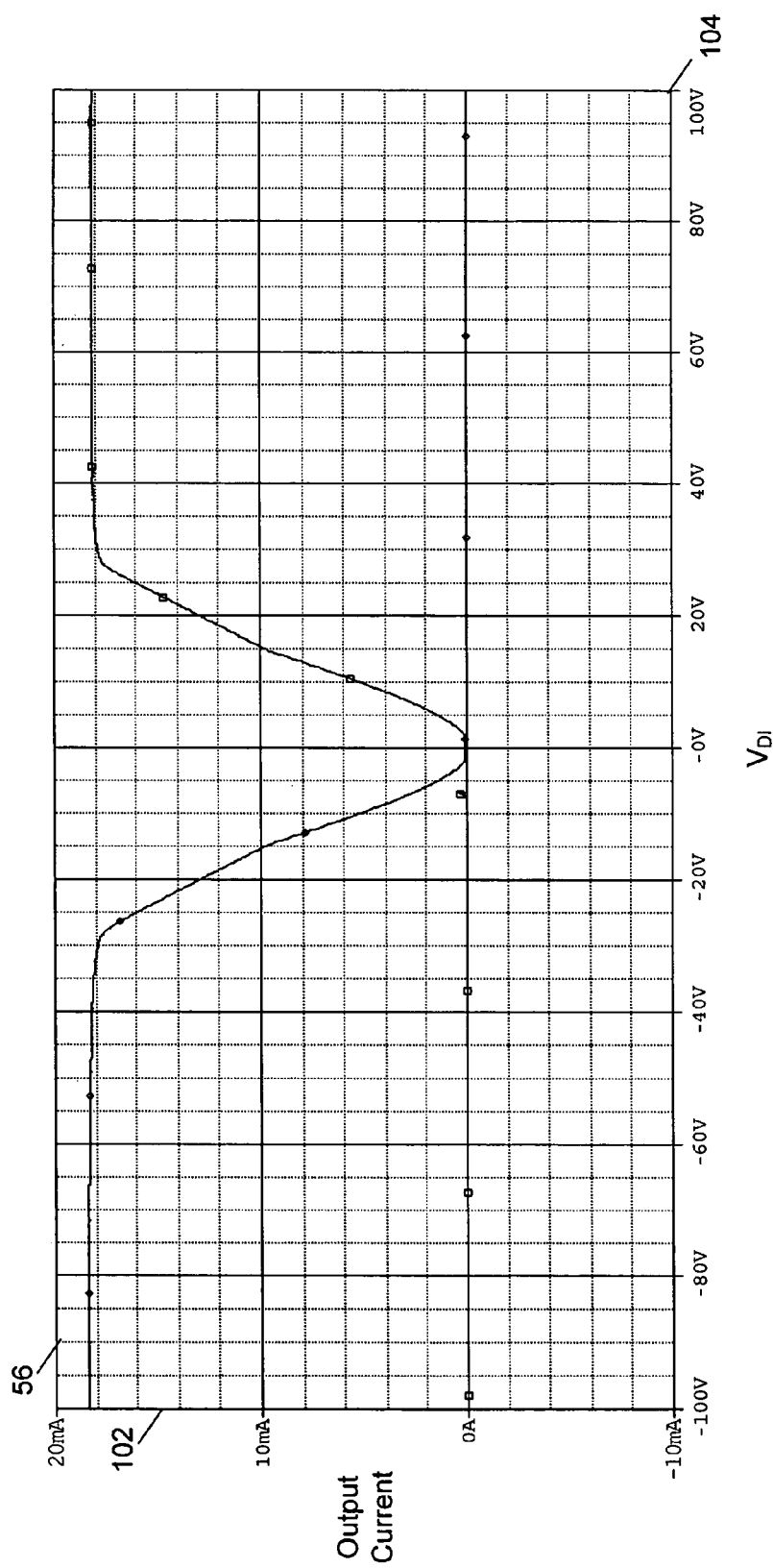
FIG. 4 is a chart that represents a transfer function of the differential amplifier stage shown in FIG. 3.

FIG. 4 is a chart 56 that provides a transfer characteristic of the cross-coupled transistors and the current mirrors (respectively included in the active loads highlighted by dashed boxes 32 and 34). In particular, the output current of differential amplifier stage 14 may be represented on the y-axis as a function of the difference voltage (i.e., $V_{DI}$) as provided by the inputs of operational amplifier 10. As represented in chart 56, as the difference voltage changes from zero volt (e.g., becomes a positive voltage or a negative voltage), current increases due to the current mirrors. For example, as the difference voltage becomes negative (e.g., −20 V), current increases based on the current mirror included in the active load highlighted in dashed box 34 (shown in FIG. 3). Alternatively, as the difference voltage becomes more positive (e.g., +20 V), current increases based on the current mirror included in the active load highlighted by dashed box 32 (shown in FIG. 3). As the difference voltage continues to move in either direction from zero volt, current increases until a current limit (e.g., approximately 20 mA) is reached. This current limitation may be provided by bipolar transistors that are highlighted by dashed boxes 58 and 60 (shown in FIG. 3). In particular, the transistors are configured to operate as Zener diodes (e.g., placing the bipolar transistors in a reverse breakdown state). By limiting the current, the maximum continuous drain current and maximum gate-to-source voltage ($V_{GS}$) is not exceeded in the transistors included in the current mirrors or transistors 40-54.

Figure 5:
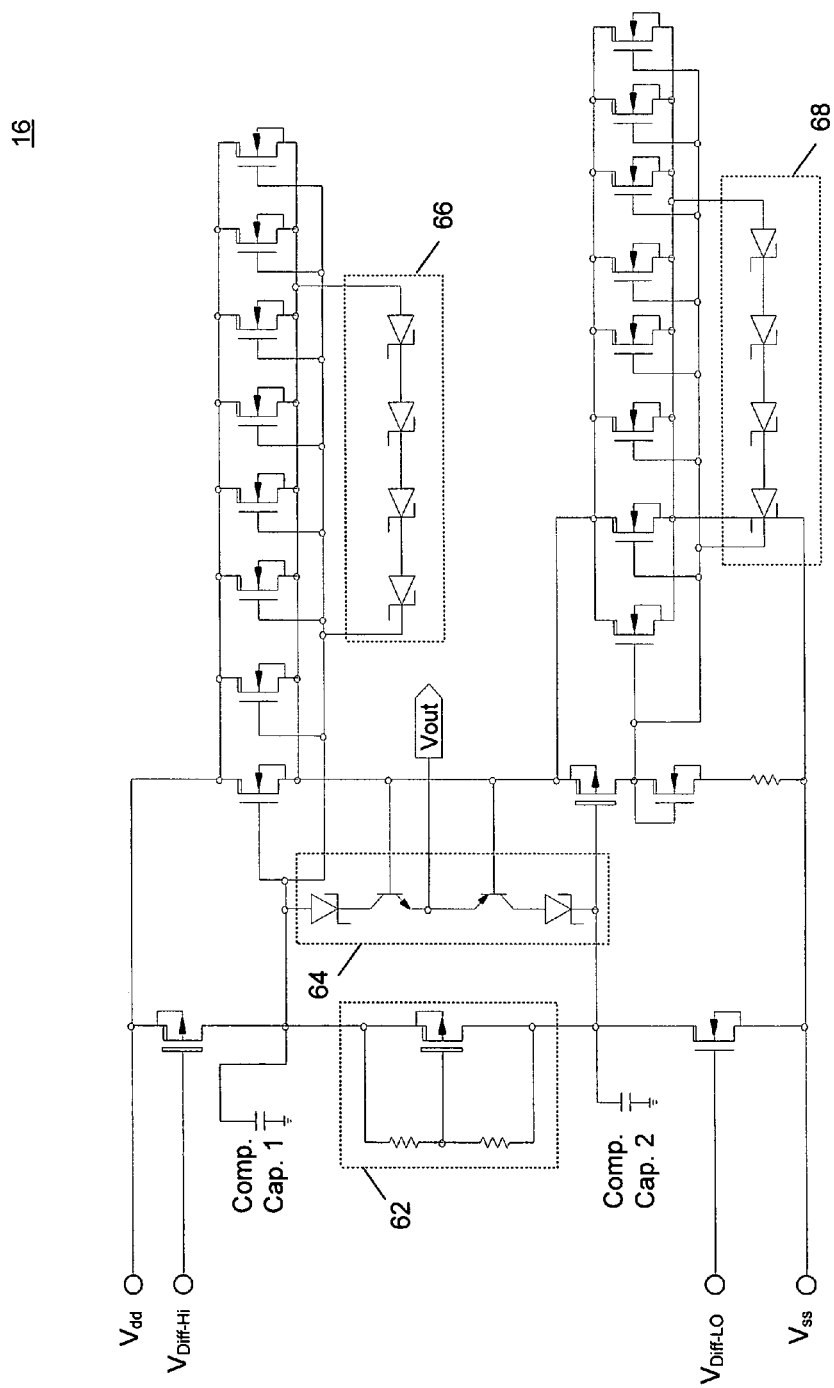
FIG. 5 is a circuit diagram representing a portion of an output stage of the operational amplifier shown in FIG. 1.

FIG. 5 is an exemplary embodiment of output stage. In this particular implementation, a class AB output buffer stage is implemented that enables operational amplifier 10 to drive resistive loads and relatively large capacitive loads. Output stage 16 includes a p-channel $V_{GS}$ multiplier (highlighted by dashed box 62) that may provide one or more biasing signals to output transistors that may be included in the output stage. In this particular arrangement, the output transistors may be double-diffused metal oxide semiconductors (DMOS) or other similar type of field-effect transistor (FET). These DMOS transistors may be configured to drive a relatively large continuous current (e.g., 160 mA) within the relatively safe operating area (SOA) of the device. For this embodiment, output stage 16 does not substantially limit the slew rate of differential amplifier stage 14 or affect the operating speed of the operational amplifier 10. Output stage 16 may also include a current limiter (highlighted by dashed box 64) that may define the maximum load current that may be supplied by operational amplifier 10. Additionally, output stage 16 may also include $V_{GS}$ protection circuits that implement Zener diodes (highlighted with dashed boxes 66 and 68). These protection circuits may prevent a breakdown in the gate-to-source voltage of the DMOS and PMOS transistors in output stage 16.

Referring to Table 1, provided below, a circuit performance software package (e.g., via a simulation provided by TSPICE from Tanner Tools of Pasadena, Calif.) simulated the performance of operational amplifier 10. In particular, a variety of input pulses were simulated to determine the corresponding transient responses and slew rate of operational amplifier 10. As shown in Table 1, seven scenarios were simulated for a variety of gains. In scenarios three and four, a compensation network was included in the operational amplifier. For the remaining scenarios a compensation network was not incorporated. For scenarios three and four, a compensation capacitor and/or resistor may be implemented to substantially reduce ringing in output signals. Referring briefly to FIG. 3 and FIG. 5, to include a compensation network, a compensation capacitor and/or resistor may be connected to differential amplifier stage 14 and output stage 16 at the appropriately identified locations (e.g., Comp. Res. 1, Comp. Res. 2, Comp. Cap. 1, Comp. Cap. 2).

Returning to Table 1, the amplitude ($V_I$) of the input pulse may be simulated for relatively small voltage swings (e.g., ±1.5 V) or for relatively wide voltage swings (e.g., ±100 V). As shown in the table, the rise and fall time of the input pulse may be varied among 1 ns, 10 ns and 50 ns. Operating temperature may also be varied from −55° C., to room temperature (e.g., 27° C.), to 150° C. In some scenarios no load was simulated, however, in scenarios three and four a resistive load and a capacitive load were respectively simulated. The two right-most columns included in Table 1 provide the respective rise and fall slew rates (in units of V/μsec) for each scenario. By comparing the rise and fall slew rates for each scenario, the slew rates are relatively symmetric.

As reported in Table 1, slew rate increases as temperature decreases. This trend may be provided by a negative temperature coefficient of biasing stage 18. At lower temperatures the biasing current $I_B$ may increase and may add to the current flowing through transistor 40 and 42 or through transistors 44 and 46 (shown in FIG. 3). By increasing the current flow through the transistors, the slew rate of operational amplifier 10 may be improved. While these current increases may be experienced at relatively low temperature (e.g., −55° C.), a similar but reversed trend may occur for relatively higher temperatures (e.g., 150° C.).

TABLE 1

| SCENARIO NUMBER | GAIN | $C_C$ | $R_C$ | $V_I$ | $T_R$ | T | LOAD | S. R. (RISE) V/μSEC | S. R. (FALL) V/μSEC |
|---|---|---|---|---|---|---|---|---|---|
| 1 | +101 | — | — | ±1.5 V | 1 ns | 27° C. | — | 839 | 794 |
| 2 | +101 | — | — | ±1.5 V | 50 ns | 27° C. | — | 816 | 702 |
| 3 | +1 | 1 pF | 9 K | ±100 V | 10 ns | 27° C. | $R_L$ = 10K | 1250 | 1110 |
| 4 | +1 | 5 pF | 9 K | ±100 V | 10 ns | 27° C. | $C_L$ = 90 pF | 526 | 490 |
| 5 | +101 | — | — | ±1.5 V | 1 ns | −55° C. | — | 1438 | 1438 |
| 6 | +101 | — | — | ±1.5 V | 1 ns | 150° C. | — | 464 | 471 |
| 7 | −100 | — | — | ±1.5 V | 1 ns | 27° C. | — | 681 | 882 |

$C_C$ = Compensation Capacitor.
$R_C$ = Zero Compensation Resistor.
$V_I$ = Input Pulse Amplitude.
$T_R$ = Input Rise/Fall time.
T = Temperature.

Figure 6:
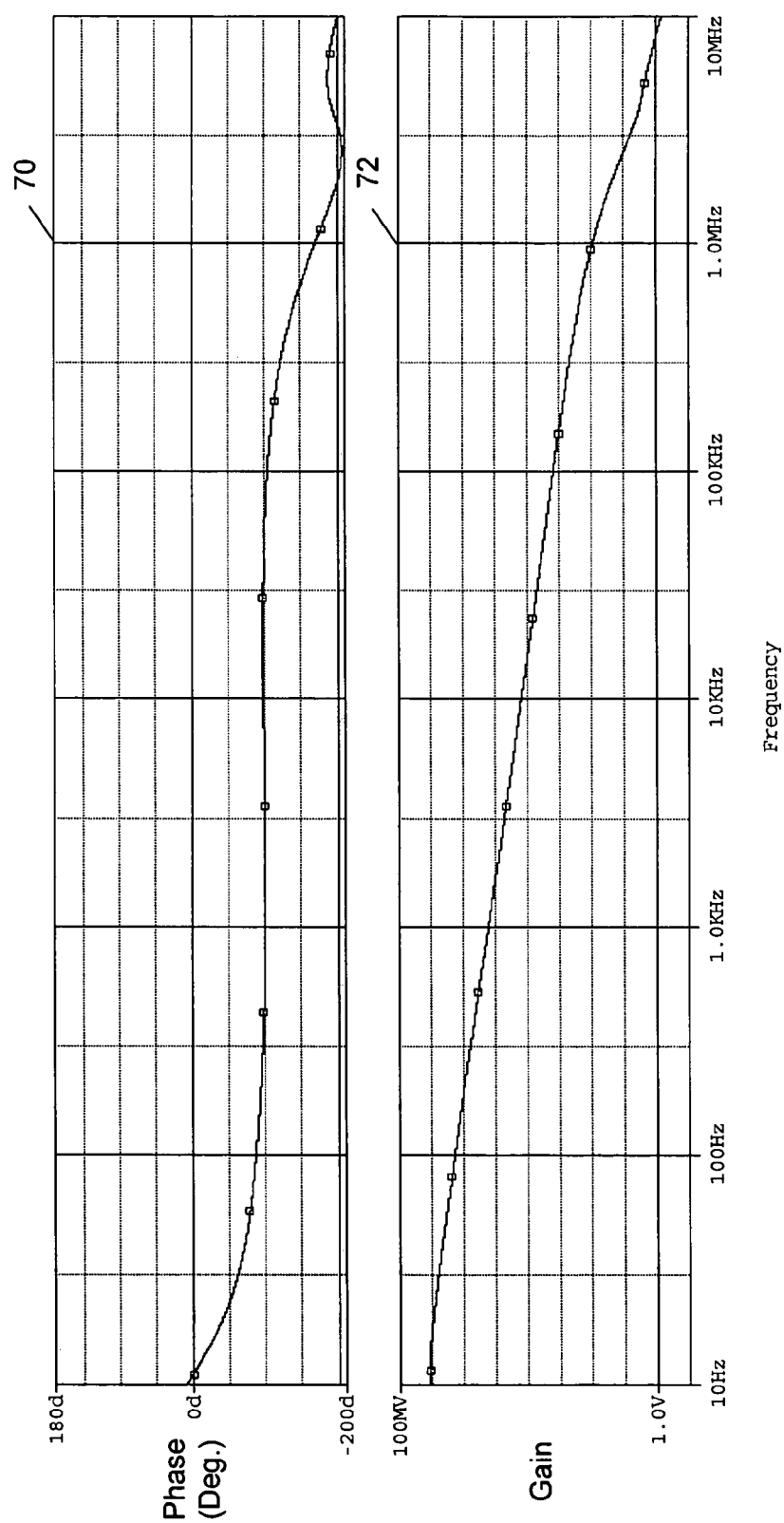
FIG. 6 is a chart that represents gain and phase responses of an operational amplifier that implements the differential amplifier stage shown in FIG. 3.

Referring to FIG. 6, two charts 70, 72 are presented that represent an alternating current (AC) analysis of operational amplifier 10. Both charts 70 and 72 represent an uncompensated spectral response of the operational amplifier. In particular, chart 70 is the phase response versus frequency while chart 72 presents gain response versus frequency. For both charts, frequency is represented on the x-axis with a lower frequency of 10 Hz and an upper frequency of 10 MHz. With reference to chart 72, the gain response of operational amplifier 10 shows a unity gain bandwidth of approximately 8.3 MHz and an open loop gain of approximately 141 dB (at 10 Hz). Chart 70 shows that the phase margin (i.e., phase difference between −180 deg at the phase corresponding to the frequency at which gain response is 0 dB) predominately has negative values that may produce an inherent instability in operational amplifier 10. By incorporating one or more compensation networks (e.g., one or more compensation resistors, one or more compensation capacitors, etc.), higher phase margins may be realized.

Figure 7:
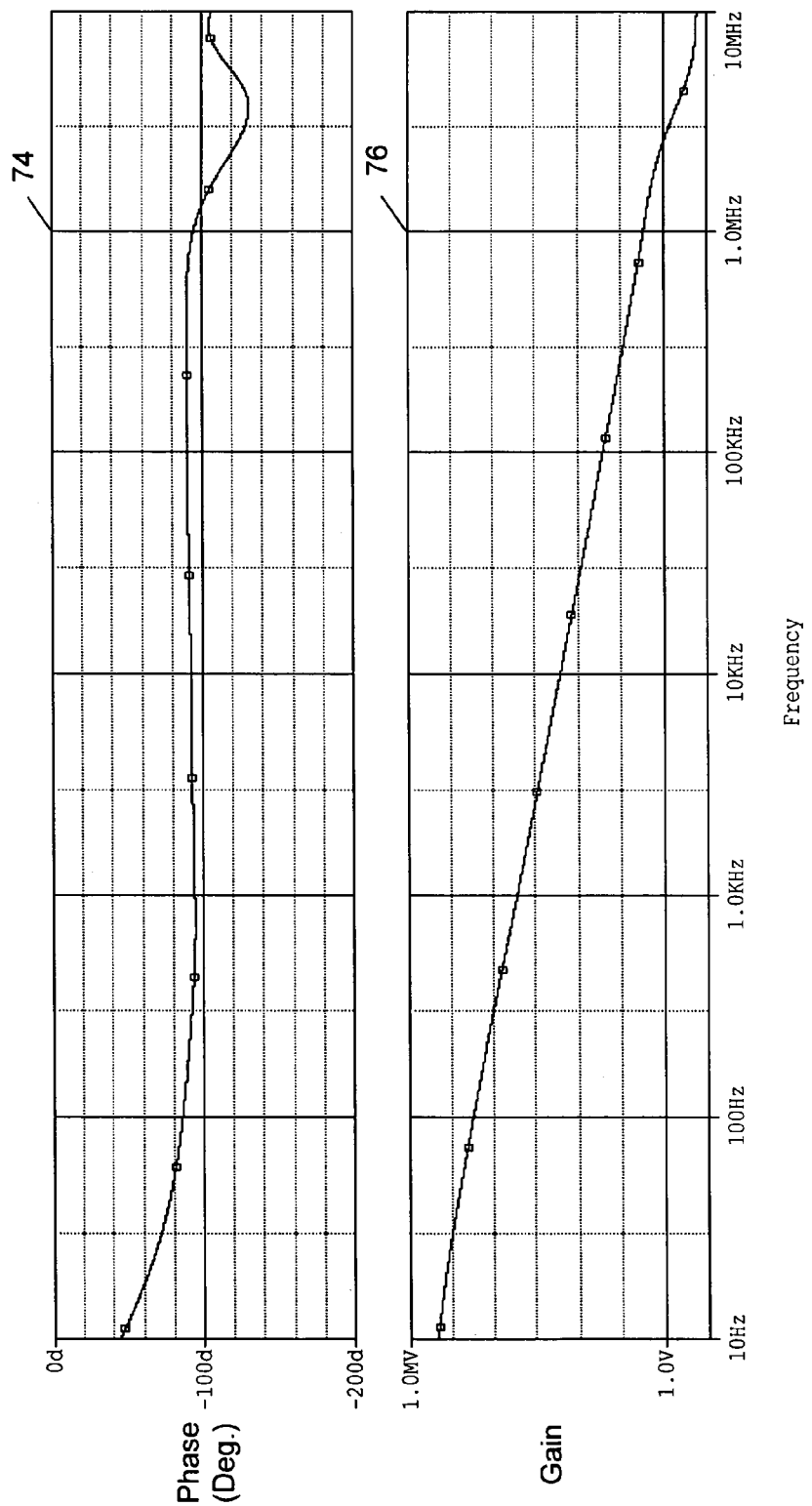
FIG. 7 is a chart that represents gain and phase responses of an operational amplifier that implements the differential amplifier stage shown in FIG. 3 and a compensation network.

Referring to FIG. 7, two charts 74 and 76 are presented that represent an AC analysis of operational amplifier 10. For this analysis operational amplifier 10 includes two compensation capacitors (e.g., a 16 pF capacitor) and two compensation resistors (e.g., a 9 kΩ). Additionally, for this analysis a 27° C. temperature was simulated. Similar to the analysis presented in FIG. 6, supply voltages were simulated for ±175 V. With reference to chart 76, the open loop gain of operational amplifier 10 is approximately 107 dB at 10 Hz. Additionally, the unity gain bandwidth is approximately 2.56 MHz. Referring to chart 74, the phase margin for scenario is approximately 57 degrees.

Figure 8:
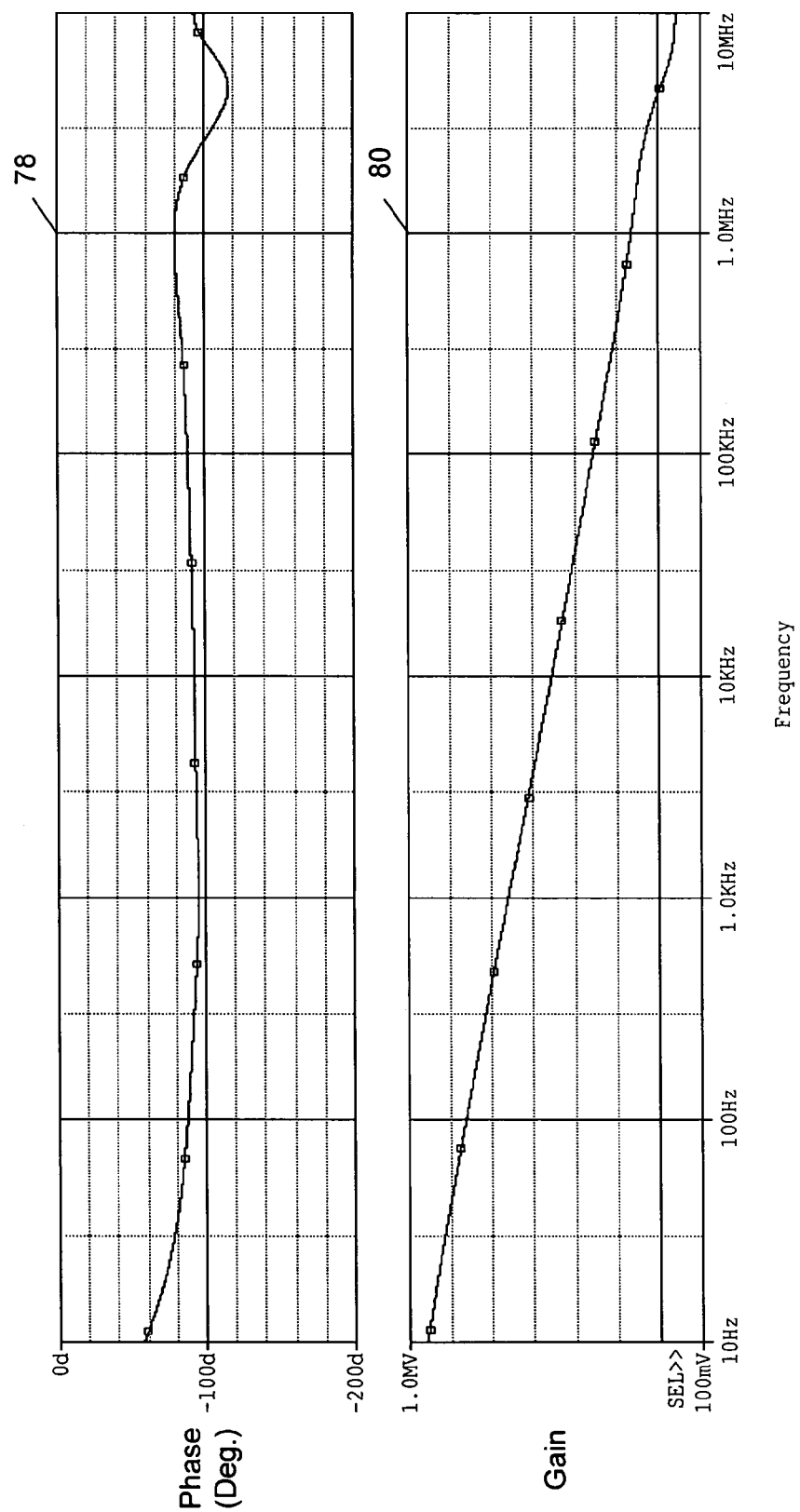
FIG. 8 is a chart that represents gain and phase responses of an operational amplifier operating at −55° C. and that implements the differential amplifier stage shown in FIG. 3 and a compensation network.

Referring to FIG. 8, two charts 78 and 80 are presented that represent an AC analysis of operational amplifier 10 configured in a manner similar to the analysis shown in FIG. 7. However, the operating temperature is decreased to −55° C. For this operating temperature, the open loop gain of the operational amplifier is 111 dB at 10 Hz and the unity gain bandwidth is 4.2 MHz. Referring to chart 78, for this scenario, the phase margin is approximately 64 degrees.

Figure 9:
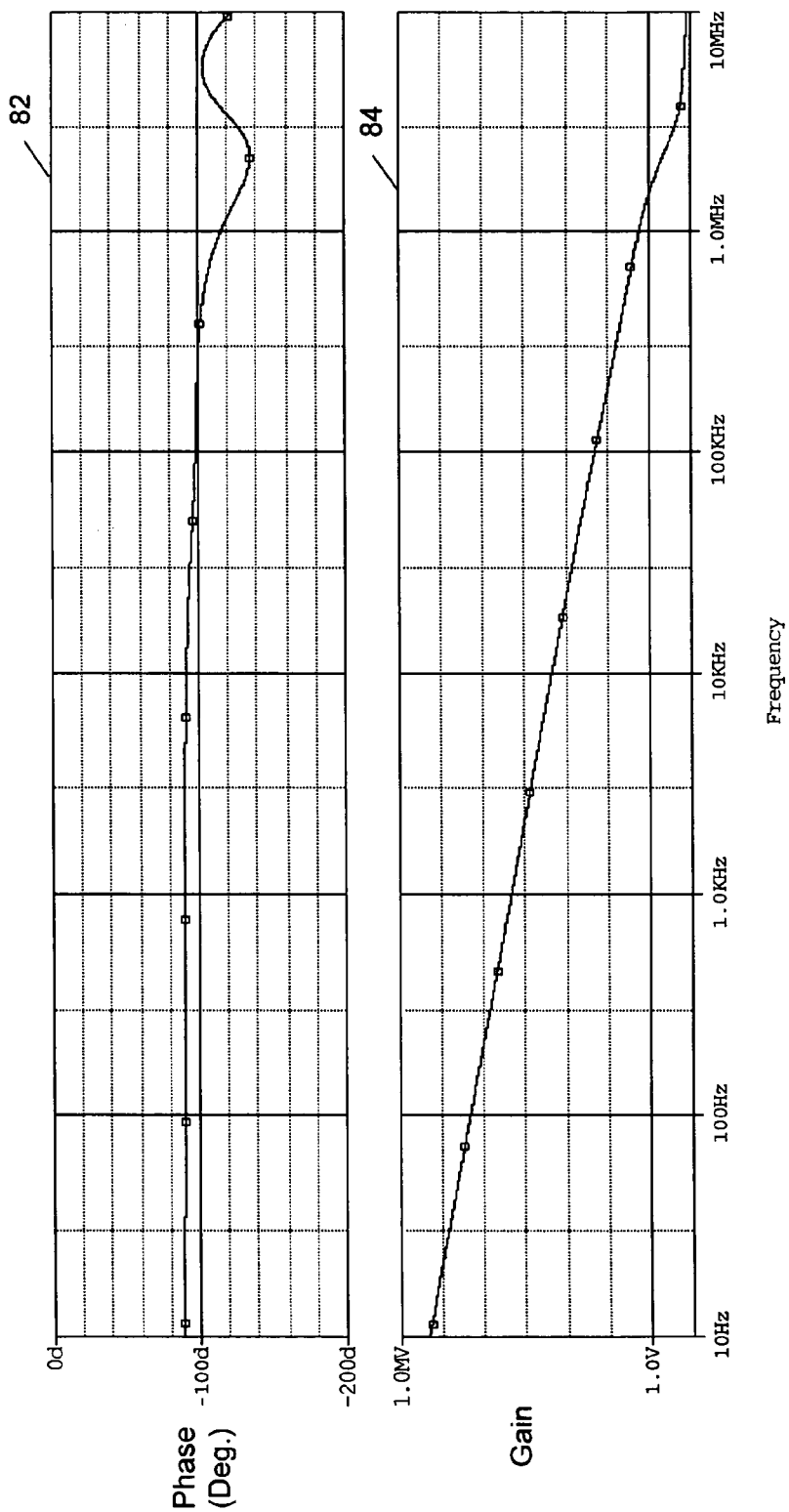
FIG. 9 is a chart that represents gain and phase responses of an operational amplifier operating at 150° C. and that implements the differential amplifier stage shown in FIG. 3 and a compensation network.

Referring to FIG. 9, two charts 82 and 84 are presented that represent an AC analysis of operational amplifier 10, which is configured similar to the configuration simulated for the responses shown in FIG. 8. However, the operating temperature is increased to 150° C. For this operating temperature the open loop gain of operational amplifier 10 is 107 dB at 10 Hz and the unity gain bandwidth is 1.5 MHz. Referring to chart 82, for this scenario, the phase margin is approximately 53 degrees.

Figure 10:
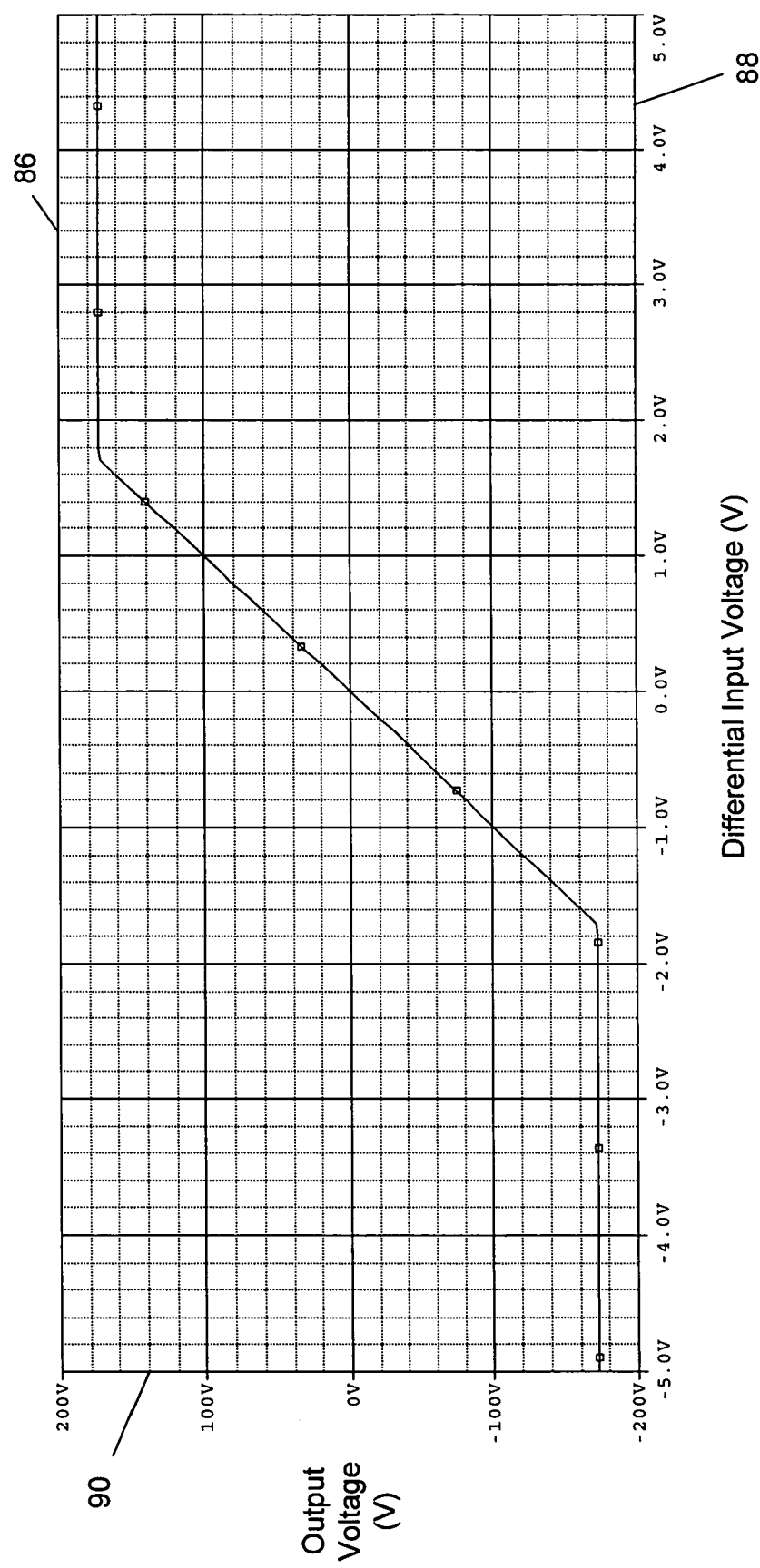
FIG. 10 is a chart that represents a transfer function of the operational amplifier shown in FIG. 1 for a supply voltage of ±175 volts.

Referring to FIG. 10, a chart 86 represents the transfer function of operational amplifier 10. X-axis 88 provides a domain of differential input voltages (e.g., −5 volts to +5 volts) that may be provided to the inputs of operational amplifier 10. Y-axis 90 provides a range of output voltages that may correspond to the differential input voltages represented on X-axis 88. For this analysis, supply voltage for operational amplifier 10 may be set to approximately ±175.0 V. As presented in chart 86, the output of operational amplifier 10 swings between approximately −172.5 V to +172.5 V for this supply voltage. The output response of operational amplifier 10 is substantially linear for differential input voltages between approximately −1.7 V to +1.7 V. As mentioned, this exemplary transfer function corresponds to a supply voltage of ±175.0 V. However, in other embodiments, the supply voltage may have a wider or narrower range. For example, a supply voltage range of 0 V to 10 V or ±10 V may be implemented, thereby demonstrating the wide voltage range capability of operational amplifier 10.

Figure 11:
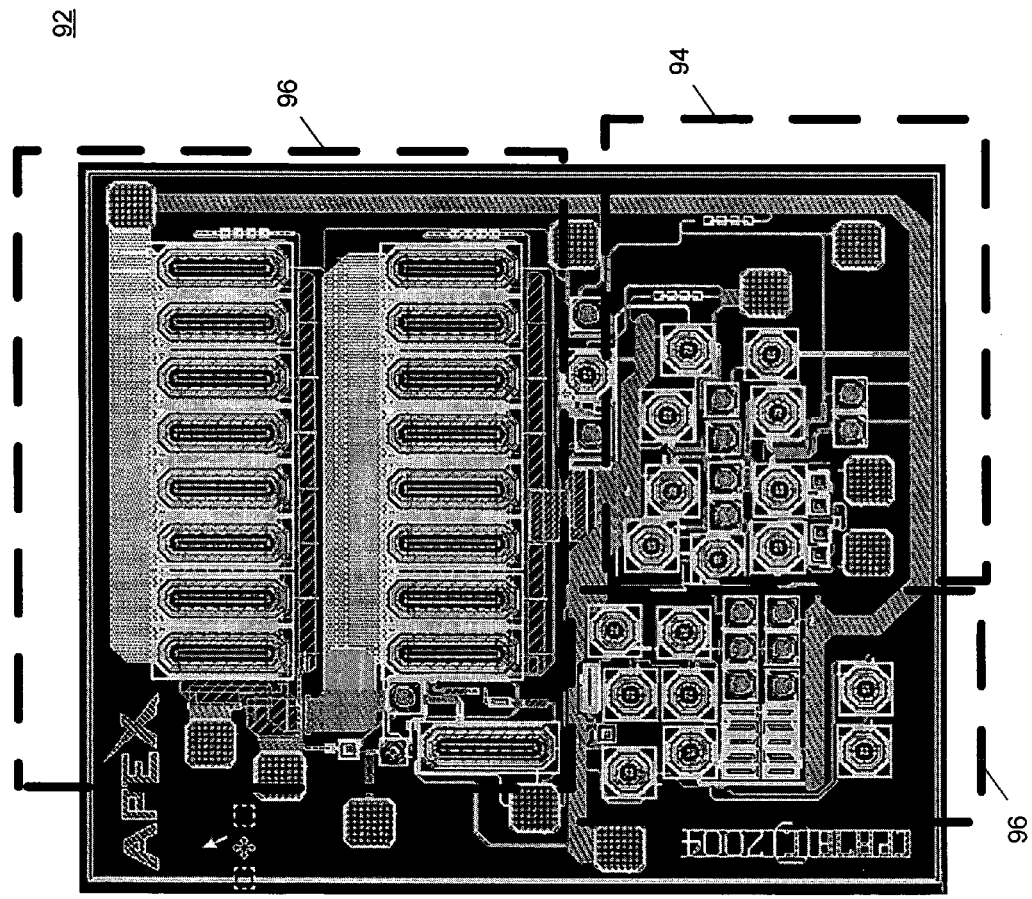
FIG. 11 is an exemplary monolithic fabrication layout of the operational amplifier shown in FIG. 1.

Referring to FIG. 11, an exemplary integrated circuit layout 92 of operational amplifier 10 is presented. By implementing high-voltage operational amplifier 10 in a monolithic IC, a single package may be produced that is capable of utilizing high-voltage supplies and providing relatively fast switching functionality. In this exemplary layout, the die size of the layout is approximately 130 millimeters by 150 millimeter. However, in other layout embodiments, larger or smaller die sizes may be implemented.

As highlighted by dashed-box 94, IC layout 92 may include a fabricated portion to provide the functionality of input stage 12 and differential amplifier stage 14. As previously mentioned, the fabricated differential amplifier stage may include two active loads (e.g., current mirrors) and cross-coupled transistors to increase slew rate and reduce quiescent current. Additionally, as highlighted by dashed-box 96, a biasing stage (e.g., biasing stage 18) may be fabricated on a portion of the monolithic IC layout 92. A dashed-box 96 highlights an output stage (e.g., output stage 16) that may be fabricated in layout 92. Similar to output stage 16, the output stage fabricated in layout 92 may be an AB class output stage.

Operational amplifier 10 may be used for one or more high-power, fast-switching applications such as driving ink jet systems. For example, operational amplifier 10 may be used in piezo-actuation and/or deflection applications. By implementing the high-voltage, fast-switching amplifier, ink droplets may be accurately displaced at relatively high speeds for depositing crisp and clear information on different types of surfaces (e.g., product containers, etc.). The combination of relatively high supply voltages and relatively high switching speeds may allow repeatable, low-cost, droplet deflection for high volume production scenarios.

A number of implementations have been described. Nevertheless, it will be understood that various modifications may be made. Accordingly, other implementations are within the scope of the following claims.

What is claimed is:

1. A differential amplifier stage, comprising:
 a first active load circuit connected to a pair of cross-coupled transistors configured to produce a differential signal, wherein the first active load circuit is configured to control the rise time of the differential signal; and
 a second active load circuit connected to the pair of cross-coupled transistors, wherein the second active load circuit is configured to control the fall time of the differential signal.

2. The differential amplifier stage of claim 1, wherein the first active load circuit includes a current mirror.

3. The differential amplifier stage of claim 1, wherein the second active load circuit includes a current mirror.

4. The differential amplifier stage of claim 1, wherein the rise time controlled by the first active load circuit is substantially equivalent to the fall time controlled by the second active load circuit.

5. The differential amplifier stage of claim 1, wherein the rise time controlled by the first active load circuit is different from the fall time controlled by the second active load circuit.

6. The differential amplifier stage of claim 1, wherein the second active load circuit includes a cascode current mirror.

7. The differential amplifier stage of claim 1, wherein the second active load circuit includes a wide swing cascode current mirror.

8. The differential amplifier stage of claim 1, wherein the second active load circuit includes a regulated cascode current mirror.

9. The differential amplifier stage of claim 1, wherein the second active load circuit includes a regulated wide swing cascode current mirror.

10. The differential amplifier stage of claim 1, wherein the second active load circuit includes a Wilson current mirror.

11. An apparatus, comprising:
 an integrated circuit comprising:
  an amplifier comprising:
   a first active load circuit connected to a pair of cross-coupled transistors configured to produce a differential signal, wherein the first active load circuit is configured to control the rise time of the differential signal; and
   a second active load circuit connected to the pair of cross-coupled transistors, wherein the second active load circuit is configured to control the fall time of the differential signal.

12. The apparatus of claim 11, wherein the first active load circuit includes a current mirror.

13. The apparatus of claim 11, wherein the second active load circuit includes a current mirror.

14. The apparatus of claim 11, wherein the rise time controlled by the first active load circuit is substantially equivalent to the fall time controlled by the second active load circuit.

15. The apparatus of claim 11, wherein the rise time controlled by the first active load circuit is different from the fall time controlled by the second active load circuit.

16. The apparatus of claim 11, wherein the slew rate of the amplifier is defined, as least in part, by the first and second active load circuits.

17. The apparatus of claim 11, further comprising:
a compensation resistor located external to the integrated circuit; and
a compensation capacitor located external to the integrated circuit, wherein the compensation resistor and the compensation capacitor are connected to the amplifier to increase stability.

18. A method, comprising:
a first active load, controlling the rise time of a differential signal, wherein the first active load is connected to a pair of cross-coupled transistors configured to produce the differential signal; and
a second active load, controlling the fall time of the differential signal, wherein the second active load is connected to the pair of cross-coupled transistors.

19. The method of claim 18, further comprising:
controlling the slew rate of an operational amplifier that includes the pair of cross-coupled transistors.

* * * * *

UNITED STATES PATENT AND TRADEMARK OFFICE
CERTIFICATE OF CORRECTION

PATENT NO. : 7,339,433 B2  Page 1 of 1
APPLICATION NO. : 11/389574
DATED : March 4, 2008
INVENTOR(S) : Bhattacharya et al.

It is certified that error appears in the above-identified patent and that said Letters Patent is hereby corrected as shown below:

Title Page, Item (75) Inventor:
  Inventor "Anindya Bhatacharya" should be --Anindya Bhattacharya--.

Title Page, Item (56) Ref. Cited:
  "2005/0271109" 12/2005 Mertelloni et al. should be --2005/0281109 12/2005 Martelloni et al.--.

Signed and Sealed this

Tenth Day of February, 2009

JOHN DOLL
*Acting Director of the United States Patent and Trademark Office*